United States Patent
Becker et al.

(10) Patent No.: US 10,332,858 B2
(45) Date of Patent: Jun. 25, 2019

(54) ELECTRONIC SANDWICH STRUCTURE WITH TWO PARTS JOINED TOGETHER BY MEANS OF A SINTERING LAYER

(71) Applicant: DANFOSS SILICON POWER GMBH, Flensburg (DE)

(72) Inventors: Martin Becker, Kiel (DE); Ronald Eisele, Surendorf (DE); Jacek Rudzki, Kiel (DE); Frank Osterwald, Kiel (DE)

(73) Assignee: Danfoss Silicon Power GmbH, Flensburg (DE)

( * ) Notice: Subject to any disclaimer, the term of this patent is extended or adjusted under 35 U.S.C. 154(b) by 21 days.

(21) Appl. No.: 15/524,038

(22) PCT Filed: Oct. 30, 2015

(86) PCT No.: PCT/EP2015/075283
§ 371 (c)(1),
(2) Date: May 3, 2017

(87) PCT Pub. No.: WO2016/071233
PCT Pub. Date: May 12, 2016

(65) Prior Publication Data
US 2018/0331065 A1 Nov. 15, 2018

(30) Foreign Application Priority Data
Nov. 7, 2014 (DE) .................. 10 2014 222 818

(51) Int. Cl.
*H01L 23/00* (2006.01)
(52) U.S. Cl.
CPC .............. *H01L 24/83* (2013.01); *H01L 24/27* (2013.01); *H01L 24/29* (2013.01); *H01L 24/32* (2013.01);
(Continued)

(58) Field of Classification Search
CPC .......... H01L 24/83; H01L 24/27; H01L 24/32
(Continued)

(56) References Cited

U.S. PATENT DOCUMENTS

| | | | | |
|---|---|---|---|---|
| 4,017,347 A | * | 4/1977 | Cleveland | B01J 35/04 148/DIG. 122 |
| 2005/0142024 A1 | * | 6/2005 | Herzog | B29C 64/153 419/53 |

(Continued)

FOREIGN PATENT DOCUMENTS

| | | |
|---|---|---|
| CN | 103635997 A | 3/2014 |
| DE | 202012004434 U1 | 8/2012 |

(Continued)

OTHER PUBLICATIONS

Rudzki J., "Aufbaukonzepte Fuer Die Leistungselektronik Mit Der Niedertemperatur-Verbindungstechnik", Book Series: Fortschritt-Berichte VDI, Series 21, No. 376, pp. 4-26, 2006.

(Continued)

*Primary Examiner* — Jami Valentine Miller
(74) *Attorney, Agent, or Firm* — McCormick, Paulding & Huber LLP

(57) ABSTRACT

An electronic sandwich structure which has at least a first and a second part to be joined, which are sintered together by means of a sintering layer. The sintering layer is formed as a substantially uninterrupted connecting layer, the density of which varies in such a way that at least one region of higher density and at least one region of lower density alternate with one another. A method for forming a sintering layer of an electronic sandwich structure, in which firstly a sintering material layer is applied substantially continuously to a first part to be joined as a connecting layer, this sintering material layer is subsequently dried and, finally, alternating regions of higher density and of lower density of the (Continued)

connecting layer are produced by sintering the first part to be joined with the sintering layer on a second part to be joined.

20 Claims, 2 Drawing Sheets

(52) U.S. Cl.
CPC ............ *H01L 2224/05639* (2013.01); *H01L 2224/2732* (2013.01); *H01L 2224/27312* (2013.01); *H01L 2224/27318* (2013.01); *H01L 2224/27418* (2013.01); *H01L 2224/27848* (2013.01); *H01L 2224/29012* (2013.01); *H01L 2224/29017* (2013.01); *H01L 2224/29019* (2013.01); *H01L 2224/29294* (2013.01); *H01L 2224/29339* (2013.01); *H01L 2224/3201* (2013.01); *H01L 2224/32245* (2013.01); *H01L 2224/8384* (2013.01); *H01L 2924/351* (2013.01)

(58) Field of Classification Search
USPC ....................................................... 257/734
See application file for complete search history.

(56) References Cited

U.S. PATENT DOCUMENTS

| 2011/0290863 A1 | 12/2011 | Kajiwara |
| 2012/0106109 A1 | 5/2012 | Kim et al. |
| 2014/0225247 A1 | 8/2014 | Becker et al. |
| 2014/0230989 A1 | 8/2014 | Becker et al. |

FOREIGN PATENT DOCUMENTS

| DE | 102011088431 A1 | 6/2013 |
| DE | 10 2012 221 396 A1 | 6/2014 |
| JP | 2002353269 A | 12/2002 |
| JP | 2006202586 A | 8/2006 |
| WO | 2013/053419 A1 | 4/2013 |
| WO | 2013/053420 A1 | 4/2013 |

OTHER PUBLICATIONS

Rudzji J., "Aufbaukonzepte Fur Die Leistungselektronik Mit Der Niedertemperatur-Verbindungstechnik", Book Series: Fortschritt-Berichte VDI,Series 21, No. 376, pp. 58-76, 2006.

Klaka S., "Eine Niedertemperatur-Verbindungstechnik Zum Aufbau Von Leistungshalbleitermodulen", Chapter 5.2, pp. 83-105, 1997 (For concise explanation of reference, see enclosed International Search Report Serial No. PCT/EP2015/075283 dated Jan. 23, 2016).

International Search Report for PCT Serial No. PCT/EP2015/075283 dated Jan. 23, 2016.

Fauty J. et al, "Room Temperature Ultrasonic Wirebonding with Large Diameter Copper Wire", International Journal of Microcircuits and Electronic Packaging, International Microelectronics & Packaging Society, vol. 22, No. 3, pp. 221-232, Sep. 21, 1999.

Mertens C. et al, "Top-side chip contacts with low temperature joining technique (LTJT)", Power Electronics Specialist Conference, vol. 6, pp. 4178-4182, Jun. 20, 2004.

Chinese Office Action with English Translation for Serial No. 2015800724877 dated Dec. 5, 2018.

* cited by examiner

ELECTRONIC SANDWICH STRUCTURE WITH TWO PARTS JOINED TOGETHER BY MEANS OF A SINTERING LAYER

CROSS-REFERENCE TO RELATED APPLICATIONS

This application is a National Stage application of International Patent Application No. PCT/EP2015/075283, filed on Oct. 30, 2015, which claims priority to German Patent Application No. 102014222818.2, filed on Nov. 7, 2014, each of which is hereby incorporated by reference in its entirety.

TECHNICAL FIELD

The invention relates to an electronic sandwich structure with a first and a second part to be joined, which are sintered together by means of a sintering layer.

BACKGROUND

Such electronic sandwich structures are used in numerous electronic components, in particular in components for power electronics. Silver sintered connections are used wherever high currents or high current densities, a very good heat transfer, i.e. high thermal flows, and a reliable mechanical load-bearing capacity have to be ensured. For this purpose, the parts to be joined that are to be sintered together are connected to one another with a material bond by a silver sintering layer that is as uniformly thin as possible (typically with a thickness of 10 to 50 µm) and is compacted to a greater or lesser degree. Apart from a uniform layer thickness, it is aimed to achieve a distribution that is as homogeneous as possible of the silver particles and other fillers in the sintered connecting layer. In particular, the so-called low-temperature connecting technique has become known for this. This is used in particular in the production of large-area bipolar semiconductors. In addition, this technique is also being used in IGBT module production. For the low-temperature connecting technique, silver powder and chemical additives at moderate temperatures of approximately 230° C. under high mechanical loads of about 20 to 30 MPa are used as a connecting material and sintering conditions are used for sintering together two parts to be joined. In this case, a porous connecting layer is created between a substrate and a semiconductor. This sintered connection is normally relatively strong and represents a homogeneous connection between the semiconductor and the substrate. Disadvantages for such a connecting method, especially with regard to mass production, are the high material costs, the incompatibility with today's soldering technologies, the quite extreme process parameters, the relatively long sintering process, the necessity to use precious metals and complex tools and machines.

In addition to this there is the fact that the parts to be joined that are to be sintered together also typically consist of dissimilar materials. This does also have the advantage that metals and metallized non- and semiconductor metals can be reliably connected. However, such dissimilar materials to be joined generally also have different coefficients of thermal expansion (CTE). This has the effect that after the joining, there are thermomechanical stresses in the material composite, which under some circumstances may lead to the electronic sandwich structure becoming damaged during use.

WO 2013/053420 A1 discloses a power semiconductor chip, which has on the upper side potential surfaces on which a metal molded body is fixed in an electrically and thermally well-conducting manner. Such a metal molded body is fastened onto a metallization layer of the semiconductor with the aid of a connecting layer by low-temperature sintering technology or else by way of diffusion soldering or adhesive bonding.

A method for providing a connection between metal molded bodies and a power semiconductor chip is described in WO 2013/053419 A1.

The thermomechanical mismatch of the parts to be joined must be sufficiently offset by the connecting layer. This means that the specified properties are retained over the fixed time period. It has therefore been attempted to form the sintered connecting layer as uniformly and thinly as possible, in order that virtually equally good properties are present at all points. There are application areas for silver sintering in which the parts to be joined have very different coefficients of thermal expansion, or at least one part to be joined is of a very fragile form. In these cases, the elasticity of the silver sintering layer is not sufficient, and the mismatch leads to shear stresses, which may ultimately end up destroying the integrity of the silver sintering layer or of a contact layer of one part to be joined.

SUMMARY

The object of the present invention is therefore to provide an electronic sandwich structure, and a method for the production thereof, with which the sintering layer is specifically influenced with respect to its properties to the extent that a high lifetime of the electronic sandwich structure connected by sintering is achieved even for parts to be joined that have different coefficients of thermal expansion. The object is therefore that of offsetting better the CTE mismatch of the parts to be joined.

According to the invention, an electronic sandwich structure has at least a first and a second part to be joined, which are sintered together by means of a sintering layer. According to the invention, the sintering layer, preferably a silver sintering layer, is influenced with respect to its flexibility and elasticity by way of a locally specifically adapted density, in order as a result to give the sintering layer an improved property of offsetting the mismatch in the coefficients of thermal expansion of the parts to be joined. In this case, the sintering layer is formed as a substantially uninterrupted connecting layer, the density of which varies in such a way that at least one region of higher density and at least one region of lower density alternate with one another. Preferably, the regions of higher or lower density are arranged regularly in defined patterns in the sintering layer with respect to their distribution in the surface area. However, it is also possible that an irregular distribution of the regions of higher and lower density within the sintering layer is provided. This density-related inhomogeneity exists after the sintering and is caused by the existence of contact areas between the parts to be joined that have a very good strength, specifically with regard to adhesion and cohesion, and also regions with lower strength, such as for example in the regions between the regions of higher density. Such alternating regions with different properties have the effect that the sintering layer according to the invention, in particular a layer produced by low-temperature sintering, is more flexible, but nevertheless has good mechanical strength properties. It is a distinct advantage if the density variations are variations in density of the same sinter layer material, rather than the use of two different materials that happen to have different densities. The use of different materials may suffer from problems associated with chemical reactions between the materials. Such problems may include lack of stability with time, causing long-term reliability issues, or corrosion-related failures. The choice of multiple materials is in addition more complex, since tailoring the properties of the materials to one another, and to the parts to be joined, may not be trivial. Controlling the final material distribution may also be more complex when more than one material is used.

Preferably, the sintering layer, which while being applied and before the sintering is free-flowing or pasty, is formed with its surface regularly uneven, i.e. it has in particular regions of greater thickness and regions of smaller thickness in defined patterns. A specific variation of the thickness of the sintering paste application to the parts to be joined has the effect that, when plane-parallel surfaces of the parts to be joined have been sintered together, there are regions of higher density in the regions of thicker sintering paste application and regions of lower density in the regions of thinner sintering paste application.

However, it is also possible to provide parts to be joined with such a surface, facing the sintering layer, that are at differing distances from one another in the final state after the sintering. This may be achieved for example by a graduation in the surface of at least one of the parts to be joined or by the surface of at least one of the parts to be joined at least in certain regions not being formed plane-parallel. Consequently, a thinner sintering layer is obtained in the regions where the parts to be joined are at a smaller distance after the sintering, whereas a thicker sintering layer is formed in the regions where the distance is greater. With an initially completely uniform sintering paste application, this finally has the effect that a higher density forms in the regions where the two parts to be joined, i.e. the two surfaces of the parts to be joined, are at a smaller distance from one another, than in the regions where the distance between the parts to be joined is greater. Depending on the form of the joining surfaces of the respective parts to be joined, a regular distribution of the regions of higher density within the sintering layer or an irregular distribution of the regions of higher density in the sintering layer can consequently be achieved.

In the case of the first exemplary embodiment, according to which the pasty or high-viscosity and only slightly free-flowing sintering material layer is applied with different thicknesses in different regions on a surface of the two parts to be joined, a height profile of the applied sintering paste is obtained after the application of the sintering paste and after the drying, but before the sintering, because of the wavy or bumpy structure. This height profile represents a first height profile and concerns the applied sintering paste. In the case of the second exemplary embodiment, according to which surfaces of the parts to be joined respectfully facing the sintering layer are provided such that at least in certain regions they are not arranged plane-parallel, there is likewise a height profile. This second height profile is consequently a height profile that is formed on the surface of at least one of the parts to be joined, the applied sintering paste, which is likewise only slightly free-flowing or pasty, or at least has a relatively high viscosity, preferably being applied substantially with a uniform thickness to the respective surface of the respective part to be joined, so that, because of the height profile of the at least one surface of one of the two parts to be joined, after the sintering there forms a connecting layer which has not only regions of differing thickness, but also regions of differing density.

The variation in the density in the direction of the layer of the connecting layer formed after the sintering offers the advantage that the connecting layer is more flexible with respect to stresses that may occur due to different materials and different coefficients of thermal expansion of the parts of the electronic sandwich structure sintered together with one another. This is therefore also referred to as "stress relief", which such a connecting layer formed according to the invention makes possible.

Preferably, the parts to be joined have surfaces respectively facing the connecting layer that at least in certain regions are arranged plane-parallel to one another. If both parts to be joined are formed in such a way that the respectively opposing part to be joined is, as it were, a mirror image of the other part to be joined with respect to the shaping of the surface, regions of plane-parallel arrangement of the mutually facing surfaces of the parts to be joined are obtained, which leads to a substantially constant thickness of the sintering layer in these regions after sintering has been performed.

Preferably, the sintering paste is applied in defined patterns of point-like circular areas or of strip-shaped areas. If, for the purpose of sintering, the parts to be joined are sintered one on top of the other, a sintering layer with a substantially constant thickness is produced when there is plane-parallel arrangement of the two mutually facing surfaces of the parts to be joined that enclose the sintering layer, regions of higher density being present after the sintering in the regions of greater application of the sintering material layer before the sintering. Point-like circular areas should be understood in this connection as meaning application of the sintering paste in droplets on the respective joining surface, such a droplet of course having a three-dimensional form, but is to be referred to here as point-like. The sintering paste is in this case preferably applied point by point, so that an altogether bumpy or wavy formation of the sintering paste initially applied on a part to be joined is produced, against which the second part to be joined is pressed during the sintering.

A specific variation of the thickness of the application of the layer to a part to be joined may be obtained for example by the choice of the application method. In the case of screen printing, thinner layer thicknesses may be achieved in masked regions than in unmasked regions of the screen. In the case of the ink-jet method, accumulations in point form are achieved, likewise contributing to regions of thicker layer thickness and regions of thinner layer thickness. In the case of spraying, line-like layer thickness variations lying next to one another are achieved, or patterned layer thickness variations can be achieved with criss-crossing traces.

Preferably, the first part to be joined is a metal and the second part to be joined is a metallized non-conductor or metallized semiconductor. And also preferably, the sintering layer is the substantially silver-containing connecting layer.

Preferably, the electronic sandwich structure is formed in such a way that the first part to be joined is a potential surface element and the second part to be joined is a substrate of a power semiconductor structure.

Also preferably, the connecting layer has a thickness of 5 to 20 µm, in particular of 10 to 15 µm, in particular 10 µm.

According to a second aspect of the invention, the method for forming a sintering layer of an electronic sandwich structure has the following steps:

a) Firstly, a free-flowing or pasty, substantially continuous sintering material layer is applied to a first part to be joined.

b) This is followed by drying this sintering material layer.

c) Alternating regions of higher density and of lower density of a sintering layer are produced by or after the sintering of the first part to be joined with the sintering layer on a second part to be joined.

Preferably, the sintering is carried out as low-temperature sintering. Also preferably, the sintering material layer is applied with a thickness varying in certain regions to the part to be joined, i.e. in the form of a layer having a first height profile, and the first part to be joined and the second part to be joined are sintered one on top of the other with their surfaces arranged plane-parallel, respectively facing the sintering layer. Preferably, the sintering layer is the substantially silver-comprising connecting layer. By applying the sintering material layer with varying thickness to the first part to be joined, a connecting layer that has regions of higher density followed or surrounded by regions of lower density is produced during the subsequent sintering of the second part to be joined to the first part to be joined. In this way the elasticity and flexibility of the connecting layer of the electronic sandwich structure is increased, so that the lifetime and reliability during operation are increased. Also in this way a sintering layer of alternating regions of higher density and of lower density is produced from a single sintering material. This avoids the separate application of two or more sintering materials of different densities, a process which may involve additional steps and which therefore may take longer, cost more, or in other ways be commercially less attractive.

Preferably, the sintering material layer is produced by screen printing, ink-jet application, spraying on or dispensing. The different methods that are respectively applied lead to a freedom of design in the application of the sintering paste in defined patterns, so that a defined distribution of the regions of increased density in the connecting layer is achieved after the drying and sintering.

Preferably, the sintering material layer is applied in points or stripes in defined patterns. However, it is also possible that the points or strips are applied in irregular patterns; as it is also possible that strips are applied in an arrangement in which they cross one another.

In order to produce regions of differing density of the connecting layer, it is also possible, according to a development of the invention, that parts to be joined are sintered one on top of the other with surfaces respectively facing the sintering layer that are at least in certain regions arranged plane-parallel. If for example one part to be joined has a thickening, i.e. a greater thickness, in its central region than in its peripheral region, and with this thickness is, as it were, sintered into the sintering layer, which has been applied with substantially the same thickness on the opposite part to be joined as the sintering material layer, regions of lower density are obtained at the peripheral regions, because the distance between the surfaces of the parts to be joined that are facing one another is greater there than in the central region of the two sintered-together parts to be joined, in which a region of increased density of the sintering layer has been produced. Preferably, the surfaces facing the sintering layer or the connecting layer are formed at least in certain regions as not plane-parallel. This means that these surfaces have the second height profile, which leads to regions of varying density in the connecting layer after the sintering.

With the connecting layer according to the invention, with varying density in its surface-wise extension, a greater reliability and flexibility can be achieved, because in this way it is especially easier to compensate for a variation in the coefficients of thermal expansion of the two parts to be joined that are to be sintered together, and may well consist of different materials, than if a connecting layer with a constant thickness and a constant density is provided.

BRIEF DESCRIPTION OF THE DRAWINGS

Further advantages and forms of the present invention are now presented on the basis of two exemplary embodiments in the following drawing, in which.

DETAILED DESCRIPTION

Figure 1A:
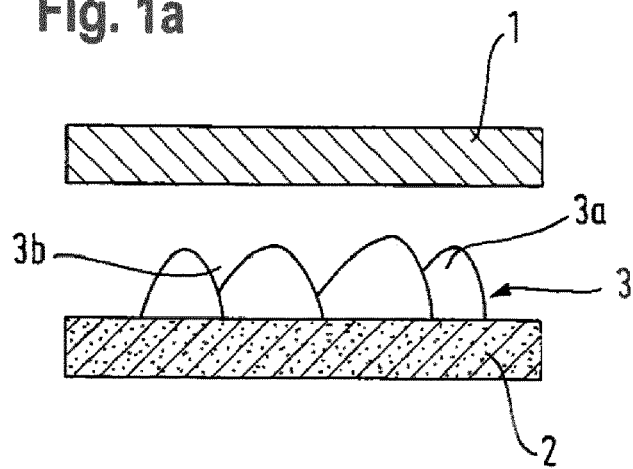
FIG. 1a) shows a basic arrangement of two parts to be joined with a sintering layer of varying thickness arranged on one part to be joined.

In FIG. 1 a), a sintering material layer 3 arranged between a first part to be joined 1 and a second part to be joined 2 is presented in a basic arrangement. The sintering material layer is in the form of an only relatively slightly free-flowing or pasty sintering paste applied to the second part to be joined 2 on its surface or joining surface facing the first part to be joined 1. The sintering paste has in this case been applied in point form, so that regions 3a of greater thickness and regions 3b of smaller thickness are present before the sintering. While being applied, the sintering paste has a viscous consistency, the viscosity of which is high enough that a complete merging together of the individual "heaps", applied in point form and forming a first height profile, does not occur. In this state, a drying of the sintering paste also takes place before the sintering, so that the form of the sintering material layer represented in FIG. 1a) corresponds substantially to a form before the sintering.

Figure 1B:
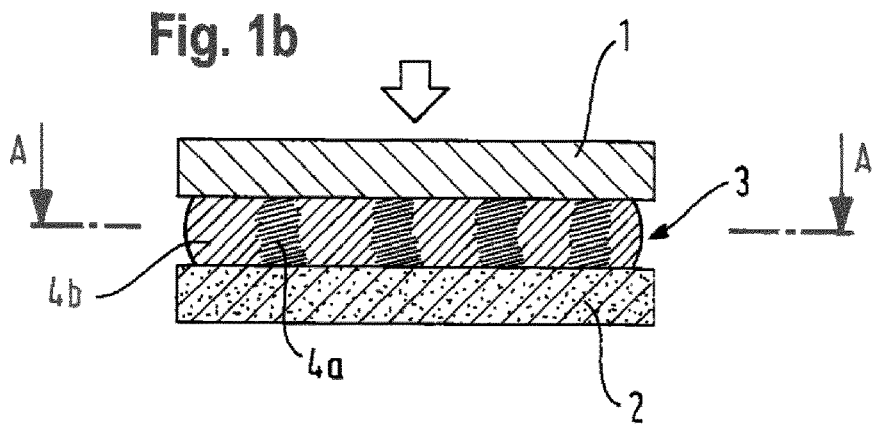
FIG. 1b) shows an electronic sandwich structure with sintered-together parts to be joined with regions of increased density in the sintering layer.

In FIG. 1b), the electronic sandwich structure according to FIG. 1a) is shown in a basic representation, but after the sintering. The sintering operation that has taken place is symbolized by the arrow shown above FIG. 1b). Between the first part to be joined 1 and the second part to be joined 2 there is formed a sintering layer 3 as a connecting layer. It has regions of differing density and is therefore inhomogeneously formed. Regions 4b of lower density are depicted as shaded, and regions 4a of higher density are identified by a higher density of shading. FIG. 1b) shows that the connecting layer is constructed in such a way that the regions 4a of higher density are surrounded by regions 4b of lower density. During the sintering operation, the regions 3a of greater thickness are compressed first and more strongly by the application of pressure that takes place during the sintering when sintering together the first part to be joined 1 and the second part to be joined 2. In a certain way, the consistency of the sintering paste in the "heaps" is thus similar to that of snow. This is so because, when compressed, the heap is initially flattened, and thereby compacted, for which reason regions 4a of higher density are present at the regions 3a of greater thickness after the sintering. Since the regions 3*b* of smaller thickness are at least initially not compressed, or compressed significantly less than the regions 3*a* of greater thickness, during the sintering together of the parts to be joined 1, 2, regions 4*b* of lower density are also formed in the regions 3*b* of smaller thickness after the sintering. The regions 4*a* of higher density are distributed regularly over the surface area of the sintering layer 3.

Figure 2:
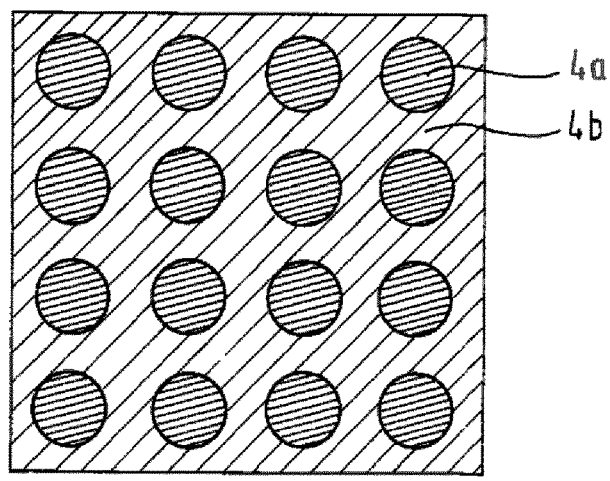
FIG. 2 shows a view of a section along the plane A-A to represent the distribution in principle of the regions of higher density in the sintering layer.

This regular arrangement of the regions 4*a* of higher density in the sintering layer 3 that are surrounded by regions 4*b* of lower density is represented in FIG. 2, which shows a sectional view along the plane A-A in FIG. 1*b*). In order to achieve such a pattern of a more or less uniform distribution of the regions 4*a* of higher density in the surface-wise extension of the connecting layer, great care and uniform application of the individual heaps of sintering paste in point form are required during the application of the sintering paste to form a sintering material layer, as in the present case the joining surface of the second part to be joined, as shown in FIG. 1*a*). The sintering layer according to the invention that is represented in FIGS. 1*b* and 2, or the connecting layer shown, with regions 4*a* of higher density and regions 4*b* of lower density contains a first exemplary embodiment, in which the joining surfaces of the first part to be joined 1 and of the second part to be joined 2 are formed substantially plane-parallel over the entire sintering layer. In the case of such a plane-parallel form of the joining surfaces of the parts to be joined 1, 2, to achieve a connecting layer according to the invention, the application of the sintering paste on a joining surface must take place in such a way that, before the sintering, the sintering paste is formed as wavy or bumpy or in the form of peaks and troughs, i.e. with a first height profile, on its surface facing the joining surface of the other part to be joined.

Figure 3A:
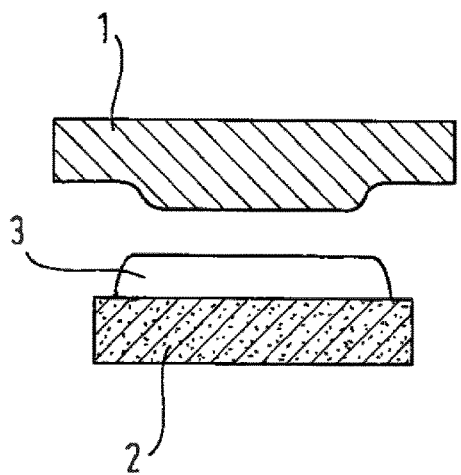
FIG. 3a) shows an exemplary embodiment with substantially constant thickness of the sintering layer, but varying distance between the joining surfaces of the parts to be joined.
Figure 3B:
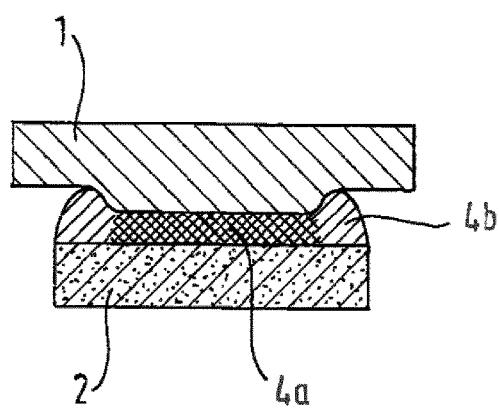
FIG. 3b) shows the example according to FIG. 3a) after the sintering, with a central region of higher density and a decentral peripheral region of lower density of the sintering layer between the two parts to be joined.

In FIG. 3, a further exemplary embodiment of an electronic sandwich structure with the connecting layer according to the invention of varying thickness is represented, to be specific in FIG. 3*a*) in a state with an applied sintering material layer or sintering paste before the sintering and in FIG. 3*b*) the result of the sintered-together electronic sandwich structure according to FIG. 3*a*), i.e. after the sintering.

The difference between the exemplary embodiment according to FIG. 3 and that according to FIGS. 1 and 2 is thus that the joining surfaces of the first part to be joined and of the second part to be joined that are facing one another for the purpose of sintering are no longer formed plane-parallel to one another and that the sintering material layer is applied substantially uniformly, i.e. with a substantially constant thickness, on the second part to be joined 2. Also in the case of this exemplary embodiment, the sintering paste has a similar consistency to in the case of the exemplary embodiment according to FIGS. 1 and 2. This is so because, if the sintering operation is performed while pressure is being applied to one or both of the parts to be joined 1, 2, raising of the joining surface of the first part to be joined 1 in its central region has the effect that a stronger compression of the sintering paste of the sintering material layer 3 is achieved than in its peripheral regions that are not affected by the raising of the surface. The two part-regions of the joining surface of the first part to be joined 1, with corresponding transitions, are however substantially plane-parallel to the joining surface of the second part to be joined 2, on which the substantially uniformly thickly applied sintering paste of the sintering material layer 3 is present. As a result of the sintering, again an electronic sandwich structure in which the two parts to be joined are sintered together and the sintering layer has regions 4*a* of higher density and regions 4*b* of lower density is then likewise produced. The regions 4*a* of higher density are identified in FIG. 3*b*) by a cross-shading and the regions 4*b* of lower density are identified by a normal shading. Also in the case of this exemplary embodiment according to FIG. 3*b*, the connecting layer does not have a homogeneous structure as far as its density in different regions is concerned. Consequently, by means of different variations in strength that are specifically brought about, the connecting layer according to the invention is for example capable of offsetting at least to a great extent different thermal expansions caused by different CTEs of the two parts to be joined 1, 2 that are to be sintered together at different temperatures of these parts to be joined.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. An electronic sandwich structure with a first and a second part to be joined, which are sintered together by means of a sintering layer,
   wherein the sintering layer is formed as an uninterrupted connecting layer, the density of which varies in such a way that at least one region of higher density and at least one region of lower density alternate with one another, and wherein the connecting layer has regions of greater thickness and regions of smaller thickness.

2. The electronic sandwich structure according to claim 1, wherein the sintering layer has regions of greater density and regions of lower density in defined patterns.

3. The electronic sandwich structure according to claim 2, wherein the defined patterns consist of point-like circular areas or of striped areas.

4. The electronic sandwich structure according to claim 1, wherein the parts to be joined have surfaces respectively facing the connecting layer that at least in certain regions are arranged plane-parallel to one another.

5. The electronic sandwich structure according to claim 4, wherein the connecting layer has a constant thickness in the respective regions of plane-parallel arrangement of the surfaces facing it of the parts to be joined.

6. The electronic sandwich structure according to claim 1, wherein the parts to be joined have surfaces respectively facing the connecting layer that at least in certain regions are not arranged plane-parallel to one another.

7. The electronic sandwich structure according to claim 1, wherein the first part to be joined is a metal and the second part to be joined is a metallized non-conductor or a metallized semiconductor.

8. The electronic sandwich structure according to claim 1, wherein the sintering layer is a silver-containing connecting layer.

9. The electronic sandwich structure according to claim 1, wherein in that the first part to be joined is a potential surface element and the second part to be joined is a substrate of a power semiconductor structure.

10. The electronic sandwich structure according to claim 1, wherein the connecting layer has a thickness of 5 to 20 μm.

11. A method for forming a sintering layer of an electronic sandwich structure according to claim 1, which has the following steps:
    applying a free-flowing or pasty continuous sintering material layer on a first part to be joined,
    drying the sintering material layer, producing in a sintering layer formed as a connecting layer alternating regions of higher density and of lower density by sintering the first part to be joined with the sintering layer on a second part to be joined.

12. The method according to claim 11, in which the sintering is carried out as low-temperature sintering.

13. The method according to claim 11, in which the first part to be joined and the second part to be joined are sintered one on top of the other with their surfaces arranged plane-parallel, respectively facing the sintering layer after the sintering layer has been applied with a thickness varying in certain regions to the first part to be joined, the sintering layer being a silver-containing connecting layer.

14. The method according to claim 11, in which the sintering material layer is produced by screen printing, ink-jet application, spraying on or dispensing.

15. The method according to claim 11, in which the sintering material layer is applied in points or stripes in defined patterns.

16. The electronic sandwich structure according to claim 2, wherein the parts to be joined have surfaces respectively facing the connecting layer that at least in certain regions are arranged plane-parallel to one another.

17. The electronic sandwich structure according to claim 3, wherein the parts to be joined have surfaces respectively facing the connecting layer that at least in certain regions are arranged plane-parallel to one another.

18. The electronic sandwich structure according to claim 1, wherein the connecting layer has the regions of greater thickness and the regions of smaller thickness in a defined pattern.

19. An electronic sandwich structure with a first and a second part to be joined, which are sintered together by means of a sintering layer, wherein the sintering layer is formed as an uninterrupted connecting layer, the density of which varies in such a way that at least one region of higher density and at least one region of lower density alternate with one another, and wherein the parts to be joined have surfaces respectively facing the connecting layer that at least in certain regions are not arranged plane-parallel to one another.

20. A method for forming a sintering layer of an electronic sandwich structure with a first and a second part to be joined, which are sintered together by means of a sintering layer, wherein the sintering layer is formed as an uninterrupted connecting layer, the density of which varies in such a way that at least one region of higher density and at least one region of lower density alternate with one another, the method comprising the following steps:
  applying a free-flowing or pasty continuous sintering material layer on a first part to be joined,
  drying the sintering material layer,
  producing in a sintering layer formed as a connecting layer alternating regions of higher density and of lower density by sintering the first part to be joined with the sintering layer on a second part to be joined;
  wherein the first part to be joined and the second part to be joined are sintered one on top of the other with their surfaces at least in certain regions not arranged plane-parallel, respectively facing the sintering material layer after the sintering material layer has been applied with a constant thickness in the respective regions to the part to be joined.

* * * * *